(12) United States Patent
Murakami

(10) Patent No.: US 8,342,276 B2
(45) Date of Patent: Jan. 1, 2013

(54) COOLING DEVICE AND ELECTRIC VEHICLE USING COOLING DEVICE

(75) Inventor: Tomoatsu Murakami, Utsunomiya (JP)

(73) Assignee: Honda Motor Co., Ltd., Tokyo (JP)

( * ) Notice: Subject to any disclaimer, the term of this patent is extended or adjusted under 35 U.S.C. 154(b) by 132 days.

(21) Appl. No.: 12/866,518

(22) PCT Filed: Jan. 22, 2009

(86) PCT No.: PCT/JP2009/051003
§ 371 (c)(1),
(2), (4) Date: Aug. 6, 2010

(87) PCT Pub. No.: WO2009/098949
PCT Pub. Date: Aug. 13, 2009

(65) Prior Publication Data
US 2010/0326750 A1    Dec. 30, 2010

(30) Foreign Application Priority Data
Feb. 6, 2008    (JP) .................................. 2008-026446

(51) Int. Cl.
*B60K 1/00* (2006.01)
(52) U.S. Cl. ..................... 180/65.31; 165/80.4; 361/698; 361/699
(58) Field of Classification Search .................. 180/165, 180/65.22, 65.31, 65.275; 165/80.4, 104.33; 361/698, 699; 174/15.1; 257/712–714
See application file for complete search history.

(56) References Cited

U.S. PATENT DOCUMENTS

| 7,417,857 | B2 | 8/2008 | Rondier et al. | |
|---|---|---|---|---|
| 2002/0011327 | A1* | 1/2002 | Fukazu et al. | 165/80.4 |
| 2006/0222910 | A1 | 10/2006 | Aoyagi et al. | |
| 2006/0264073 | A1 | 11/2006 | Yang et al. | |
| 2006/0280977 | A1* | 12/2006 | Sakajo et al. | 429/23 |
| 2007/0227708 | A1* | 10/2007 | Hom et al. | 165/121 |
| 2009/0090490 | A1 | 4/2009 | Yoshida et al. | |

FOREIGN PATENT DOCUMENTS

| AT | 377644 | 4/1985 |
|---|---|---|
| CN | 1860607 | 11/2006 |

(Continued)

OTHER PUBLICATIONS

Chinese Office Action for Application No. 200980104235.2, dated Sep. 22, 2011.
Supplementary European Search Report for Application No. 09707911.5, dated May 23, 2011.

(Continued)

*Primary Examiner* — John Walters
*Assistant Examiner* — James Triggs
(74) *Attorney, Agent, or Firm* — Nelson Mullins Riley & Scarborough LLP; Anthony A. Laurentano

(57) ABSTRACT

Provided are a cooling device and an electric vehicle using the cooling device. The cooling device is used for cooling a switching module containing a switching element as a heating element. The cooling device includes a cooling liquid channel having a plurality of cooling fins through which the cooling liquid flows. The cooling fins have a cut-off portion at the position corresponding at least to a center portion of chips constituting the switching module in the flow direction of the cooling liquid. A chamber is formed in the cooling liquid channel by the cut-off portion.

14 Claims, 10 Drawing Sheets

FOREIGN PATENT DOCUMENTS

| | | |
|---|---|---|
| JP | 2002-46482 | 2/2002 |
| JP | 2003-60145 | 2/2003 |
| JP | 2004-349324 | 12/2004 |
| JP | 2007-281163 | 10/2007 |

OTHER PUBLICATIONS

International Search Report for Application No. PCT/JP2009/051003, dated Apr. 21, 2009.

* cited by examiner

COOLING DEVICE AND ELECTRIC VEHICLE USING COOLING DEVICE

RELATED APPLICATIONS

This application is a 35 U.S.C. 371 national stage filing of International Application No. PCT/JP2009/051003, filed Jan. 22, 2009, which claims priority to Japanese Patent Application No. 2008-026446 filed on Feb. 6, 2008 in Japan. The contents of the aforementioned applications are hereby incorporated by reference.

TECHNICAL FIELD

The present invention relates to a cooling apparatus (device) for cooling heat emission devices such as switching devices or the like, as well as to an electric vehicle incorporating such a cooling apparatus therein.

BACKGROUND ART

There have heretofore been widely used DC/DC converter apparatus as switching power supplies having switching devices such as MOSFETs, IGBTs, or the like.

For example, there has been proposed a vehicle (hereinafter referred to as an "electric vehicle") incorporating a motor as a propulsive drive source, and a DC/DC converter apparatus for increasing and reducing a DC voltage. The DC/DC converter is connected between an electricity storage device and the motor, which is energized by an inverter. On the electric vehicle, when the motor is energized, voltage across the electricity storage device is increased by the DC/DC converter apparatus and applied to the inverter. When the motor regenerates electric power, the regenerated voltage from the inverter is lowered by the DC/DC converter apparatus and applied in order to charge the electricity storage device.

There has also been proposed a vehicle (hereinafter referred to as a "fuel cell vehicle") as another form of electric vehicle. The fuel cell vehicle includes a fuel cell directly connected to a motor, which is energized by an inverter. A DC/DC converter apparatus for increasing and reducing a DC voltage is connected between an electricity storage device and a junction between the fuel cell and the motor. The fuel cell is used as a main power supply, whereas the electricity storage device is used as an auxiliary power supply for assisting the main power supply.

On the fuel cell vehicle, when the motor is energized, voltage across the fuel cell and voltage across the electricity storage device, which has been increased by the DC/DC converter apparatus, are added together, and a sum voltage is applied to the inverter. When the motor regenerates electric power, the regenerated voltage from the inverter is lowered by the DC/DC converter apparatus and applied in order to charge the electricity storage device. If the electric power generated by the fuel cell is excessive, then the electrical power is lowered in voltage and applied in order to charge the electricity storage device.

The DC/DC converter apparatus comprises a semiconductor module (switching module) including switching devices and diodes. In particular, the switching devices need to be cooled sufficiently because the switching devices generate a considerable amount of heat when energized. Generally, cooling apparatus having cooling liquid passages therein have been used. For use in applications on vehicles, it is important for the cooling devices to meet both requirements of providing sufficient cooling capability as well as being small in size.

For example, Japanese Laid-Open Patent Publication No. 2004-349324 proposes a cooling apparatus in which an IGBT module is disposed directly on a flat base plate together with cooling fins. In the cooling apparatus, the cooling fins are disposed at positions corresponding to chips that act as heat emission devices. Cooling fins that are positioned immediately before the heat emission devices along the direction in which the cooling liquid flows have cutouts therein, so as to provide edges at cooling liquid inlets of the cooling fins for disturbing the cooling liquid and thereby increase the cooling effect.

DISCLOSURE OF INVENTION

According to the apparatus disclosed in Japanese Laid-Open Patent Publication No. 2004-349324, the chips are disposed so as to correspond to the cooling fins, and the edges are provided at the cooling liquid inlets of the cooling fins for disturbing the cooling liquid. Therefore, the edges increase the pressure loss of the cooling liquid, thus requiring an increase in the size of a circulation pump for the cooling liquid, and hence the size of the cooling apparatus is increased.

Furthermore, since the inlet of the cooling fins causes a disturbed flow of the cooling liquid, the cooling liquid flow is regulated and the cooling capability of the cooling liquid is lowered nearly immediately below the centers of the chips. Therefore, it is necessary to provide the edges so as to correspond to the chips. As a result, pressure loss caused by the cooling liquid passage is further increased.

The present invention has been made in view of the above conventional drawbacks. It is an object of the present invention to provide a cooling apparatus, which can be reduced in size and offer an increased cooling capability. The present invention further relates to an electric vehicle incorporating such a cooling apparatus therein.

According to the present invention, a cooling apparatus for cooling a heat emission device comprises a cooling liquid passage for passing a cooling liquid therethrough, the cooling liquid passage having a plurality of cooling fins, and the cooling fins having recesses defined therein at positions corresponding to at least a center of the heat emission device in a flow direction of the cooling liquid, the recesses defining a chamber in the cooling liquid passage.

With the above arrangement, the cooling liquid, which flows through the cooling liquid passage, can flow from narrow passageways between the cooling fins into wider spaces provided by the chambers, in which the cooling liquid develops disturbances directly below the heat emission devices. Stated otherwise, since the chambers are disposed so as to correspond to the centers of the heat emission devices, the heat emission devices are cooled highly efficiently and the cooling capability of the cooling apparatus is increased.

If the height of the chamber is greater than the height of the cooling fins, then since the volume of the chambers is greater than the volume at the cooling fins, the cooling capability of the cooling apparatus can be further increased.

If the cooling fins have round portions at ends thereof in at least the flow direction of the cooling liquid, then the pressure loss of the cooling liquid, which is caused at the ends of the cooling fins, is effectively reduced. Smooth flow of the cooling liquid and an increased cooling capability thereby can be achieved. Further, the circulation pump used in the cooling apparatus can be reduced in size. As a result, the cooling apparatus and a vehicle incorporating the cooling apparatus therein can be reduced both in size and weight.

If a heat spreader is disposed between the heat emission device and the cooling fins, and a plurality of the heat emission devices are disposed in common on the heat spreader, then it is possible to radiate heat highly efficiently from the heat emission devices through a wider area.

An electric vehicle according to the present invention comprises the cooling apparatus described above, an electric motor for rotating wheels, an electric generator and an electricity storage device for supplying electric power in a parallel relationship to the electric motor, and a DC/DC converter connected between the electricity storage device and the electric generator, for converting voltage generated by the electricity storage device and applying the converted voltage to the electric motor, and for converting voltage regenerated by the electric motor in a regenerative mode or voltage generated by the electric generator and applying the converted voltage to the electricity storage device, the heat emission device including a switching device provided in the DC/DC converter. The electric generator may comprise a fuel cell.

With the above arrangement, the DC/DC converter can be cooled efficiently, and the cooling apparatus can be reduced in size. The electric vehicle can also be reduced in size and weight, and the cooling apparatus can be installed on the vehicle with greater layout freedom.

BEST MODE FOR CARRYING OUT THE INVENTION

A cooling apparatus according to a preferred embodiment of the present invention, in relation to electric vehicles incorporating the cooling apparatus therein, will be described below with reference to the accompanying drawings.

First, basic structural details of a fuel cell vehicle 20, which serves as an electric vehicle incorporating a cooling apparatus 10 therein according to the present embodiment, will be described below.

Figure 1:
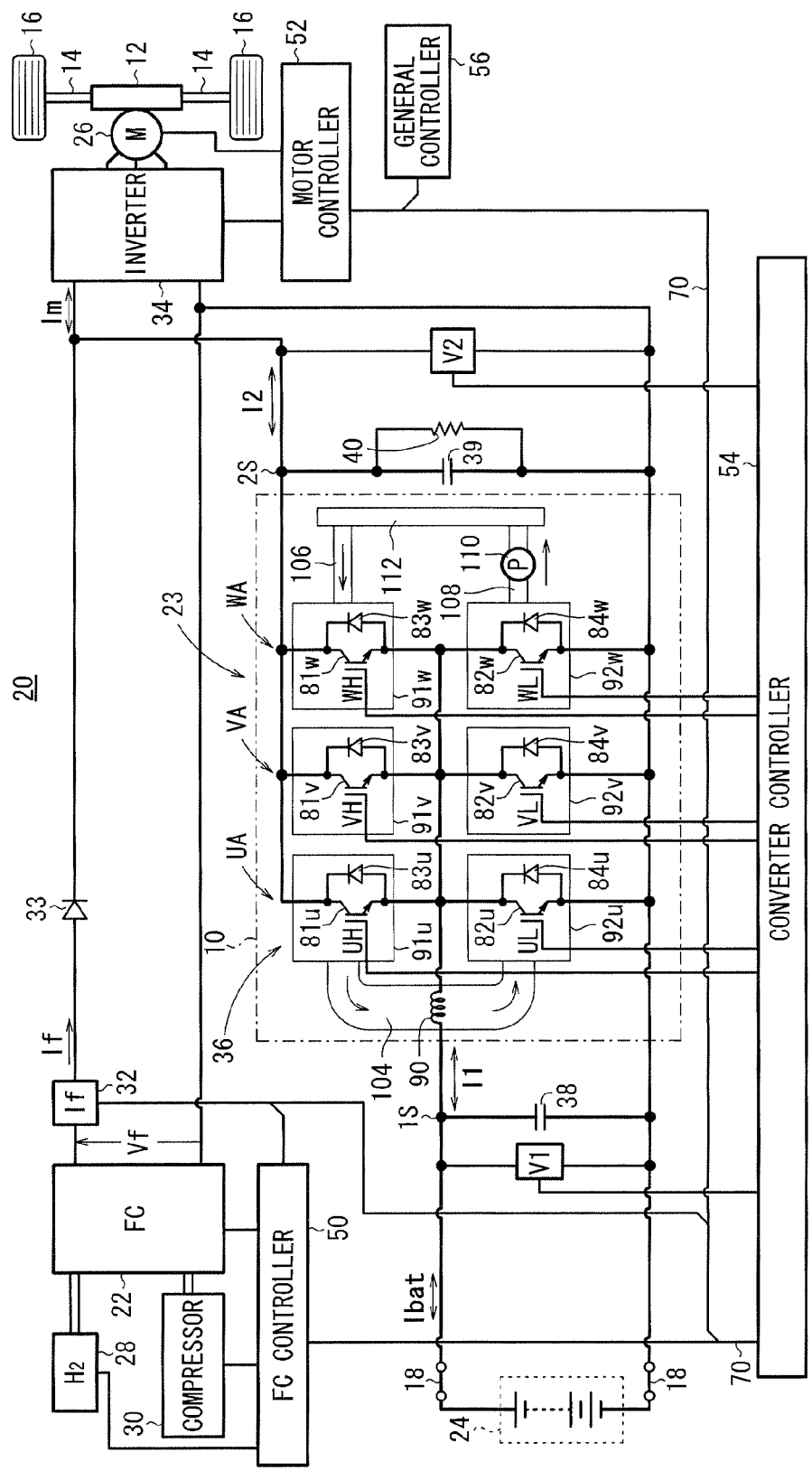
FIG. 1 is a circuit diagram of a fuel cell vehicle according to an embodiment of the present invention.

As shown in FIG. 1, the fuel cell vehicle 20 basically comprises a hybrid power supply system including a fuel cell 22 and an electricity storage device (referred to as a "battery") 24 which operates as an energy storage, a traction motor 26 supplied with current (electric power) from the hybrid power supply system through an inverter 34, and a DC/DC converter apparatus 23. The DC/DC converter apparatus 23 converts voltages between a primary end 1S connected to the battery 24 and a secondary end 2S connected to the fuel cell 22 and the motor 26 (the inverter 34). The battery 24 is connected through power lines 18 to the primary end 1S of the DC/DC converter apparatus 23.

Rotation of the motor 26 is transmitted via a speed reducer 12 and axles 14 to wheels 16, thereby rotating the wheels 16.

The DC/DC converter apparatus 23 comprises a DC/DC converter (vehicular DC/DC converter) 36, and a converter controller 54 for controlling the DC/DC converter 36.

The fuel cell 22 comprises a stacked structure made up of cells each comprising an anode, a cathode, and a solid polymer electrolyte membrane sandwiched between the anode and the cathode. The fuel cell 22 is connected to a hydrogen tank 28 and an air compressor 30 by pipes. The fuel cell 22 generates a current If due to an electrochemical reaction between a reactant gas (fuel gas) made up of hydrogen and air (oxygen-containing gas). The generated current If is supplied through a current sensor 32 and a diode (also referred to as a "disconnecting diode") 33 to the inverter 34 and/or to the DC/DC converter 36.

The inverter 34 converts the direct current If into an alternating motor current Im, which is supplied to the motor 26. The inverter 34 also converts an alternating motor current that is generated by the motor 26 in a regenerative mode into a direct motor current Im, which is supplied from the secondary end 2S to the primary end 1S through the DC/DC converter 36.

A secondary voltage V2, which may be the regenerated voltage in the regenerative mode or the generated voltage Vf across the fuel cell 22, is converted into a low primary voltage V1 by the DC/DC converter 36.

The battery 24, which is connected to the primary end 1S, may comprise a lithium ion secondary battery or a capacitor. In the present embodiment, the battery 24 comprises a lithium ion secondary battery.

The battery 24 supplies the motor current Im through the DC/DC converter 36 to the inverter 34.

Smoothing capacitors 38, 39 are connected respectively across the primary and secondary ends 1S, 2S. A resistor 40 is connected across the smoothing capacitor 39, i.e., across the fuel cell 22.

A system including the fuel cell 22 is controlled by an FC controller 50. A system including the inverter 34 and the motor 26 is controlled by a motor controller 52, which includes an inverter driver. A system including the DC/DC converter 36 is controlled by the converter controller 54, which includes a converter driver.

The FC controller 50, the motor controller 52, and the converter controller 54 are controlled by a general controller 56, which serves as a higher-level controller for determining a total load Lt on the fuel cell 22, etc. The general controller 56, the FC controller 50, the motor controller 52, and the converter controller 54 are connected to each other via communication lines 70, such as a CAN (Controller Area Network) that serves as an intravehicular LAN. The general controller 56, the FC controller 50, the motor controller 52, and the converter controller 54 perform various functions by sharing input and output information from various switches and sensors, and by executing programs stored in ROMs under CPUs based on input and output information from the various switches and sensors.

The DC/DC converter 36 comprises three phase arms connected mutually in parallel between a first power device (the battery 24) and a second power device {the fuel cell 22 or the regenerative power supply (the inverter 34 and the motor 26)}. The three phase arms {a U-phase arm UA (81$u$, 82$u$), a V-phase arm VA (81$v$, 82$v$), and a W-phase arm WA (81$w$, 82$w$)} are made up of upper arm switching devices 81 {81$u$, 81$v$, 81$w$ (81$u$ through 81$w$)} and lower arm switching devices 82 (82$u$, 82$v$, 82$w$ (82$u$ through 82$w$)}, such as IGBTs or the like.

Diodes 83$u$, 83$v$, 83$w$, 84$u$, 84$v$, 84$w$ (inverse parallel diodes) are connected inversely across the respective arm switching devices 81$u$, 81$v$, 81$w$, 82$u$, 82$v$, 82$w$.

A single reactor 90 for discharging and storing energy when the DC/DC converter 36 converts between the primary voltage V1 and the secondary voltage V2 is inserted between the battery 24 and the commonly connected midpoints of the three phase arms (the U-phase arm UA, the V-phase arm VA, and the W-phase arm WA).

The upper arm switching devices 81 (81$u$ through 81$w$) are turned on by (high levels of) gate drive signals (drive voltages) UH, VH, WH output from the converter controller 54. The lower arm switching devices 82 (82$u$ through 82$w$) are turned on by (high levels of) gate drive signals (drive voltages) UL, VL, WL output from the converter controller 54.

Basic operations of the DC/DC converter 36, which is controlled by the converter controller 54, will be described below.

In a voltage increasing mode, the converter controller 54 turns on the lower arm switching device 82$u$ in order to store energy in the reactor 90 with a battery current Ibat (a primary current I1), and at the same time, the converter controller 54 supplies a secondary current I2 from the capacitor 39 to the inverter 34. Then, when the converter controller 54 turns off the lower arm switching device 82$u$, the diodes 83$u$ through 83$w$ are rendered conductive in order to discharge energy from the reactor 90, store the energy in the capacitor 39, and to supply the secondary current I2 to the inverter 34. Thereafter, the converter controller 54 similarly turns on the lower arm switching device 82$v$, and then turns off the lower arm switching device 82$v$ in order to render the diodes 83$u$ through 83$w$ conductive. Then, the converter controller 54 turns on the lower arm switching device 82$w$, and then turns off the lower arm switching device 82$w$ in order to render the diodes 83$u$ through 83$w$ conductive. Then, according to the above sequence, the converter controller 54 turns on the lower arm switching device 82$u$, thereby controlling the converter controller 54 in a rotation switching process.

The upper arm switching devices 81$u$ through 81$w$ and the lower arm switching devices 82$u$ through 82$w$ have ON duty ratios thereof determined, so as to keep the output voltage V2 at the level of a command voltage from the general controller 56.

In a voltage reducing mode, for supplying secondary current I2 from the secondary end 2S of the DC/DC converter 36 to the battery 24 at the primary end 1S, the converter controller 54 controls the DC/DC converter 36 in a rotation switching process by turning on the upper arm switching device 81$u$, so as to store energy in the reactor 90 with secondary current I2 output from the capacitor 39, while at the same time to supply primary current I1 from the capacitor 38 to the battery 24. Then, the converter controller 54 controls the DC/DC converter 36 by turning off the upper arm switching device 81$u$, so as to render the diodes 84$u$ through 84$w$ conductive as flywheel diodes to discharge energy from the reactor 90, store the energy in the capacitor 38, and supply the primary current I1 to the battery 24. Thereafter, the converter controller 54 controls the DC/DC converter 36 similarly by turning on the upper arm switching device 81$v$, turning off the upper arm switching device 81$v$ so as to render the diodes 84$u$ through 84$w$ conductive, then turning on the upper arm switching device 81$w$, turning off the upper arm switching device 81$w$ so as to render the diodes 84$u$ through 84$w$ conductive, thereafter turning on the upper arm switching device 81$u$, and so on.

Basic operations of the DC/DC converter 36 controlled by the converter controller 54 have been described above.

Figure 2A:
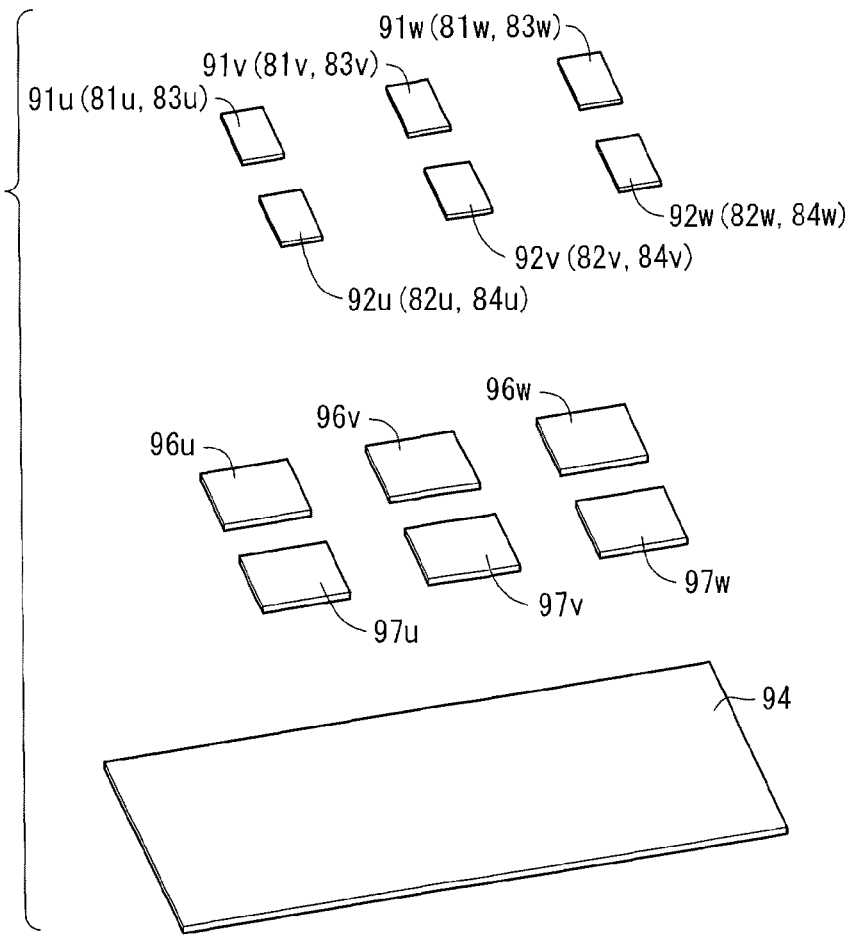
FIG. 2A is an exploded perspective view of a switching module of a DC/DC converter.
Figure 2B:
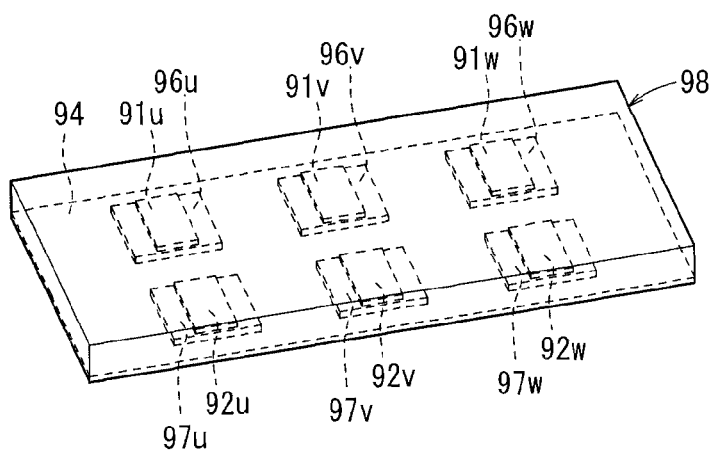
FIG. 2B is a perspective view of the switching module shown in FIG. 2A.

As shown in FIGS. 1, 2A and 2B, the arm switching devices 81$u$ through 81$w$ and 82$u$ through 82$w$, and the corresponding diodes 83$u$ through 83$w$ and 84$u$ through 84$w$, are assembled as upper chips 91 {91$u$, 91$v$, 92$w$ (91$u$ through 91$w$)} and lower chips 92 {92$u$, 92$v$, 92$w$ (92$u$ through 92$w$)}, respectively, wherein the arm switching devices and the diodes are integrated in respective sets. For example, the arm switching device 81$u$ and the diode 83$u$ are integrated in one set.

The upper chips 91$u$ through 91$w$ and the lower chips 92$u$ through 92$w$ are fixedly mounted on a single (common) heat radiating plate (heat spreader) 94 made of metal (e.g., copper, aluminum, or the like), with insulating boards 96 {96$u$, 96$v$, 96$w$ (96$u$ through 96$w$)} and insulating boards 97 {97$u$, 97$v$, 97$w$ (97$u$ through 97$w$)} interposed therebetween. The chips, the heat radiating plate, and the insulating boards are integrally molded in order to form a switching module 98 (see FIGS. 2B and 7).

The switching module 98 is constructed as a so-called 6-in-1 module. The arm switching devices 81$u$ through 81$w$ and 82$u$ through 82$w$ have respective gate terminals connected to the converter controller 54.

The cooling apparatus 10 for cooling the DC/DC converter 36 will be described below.

Figure 3:
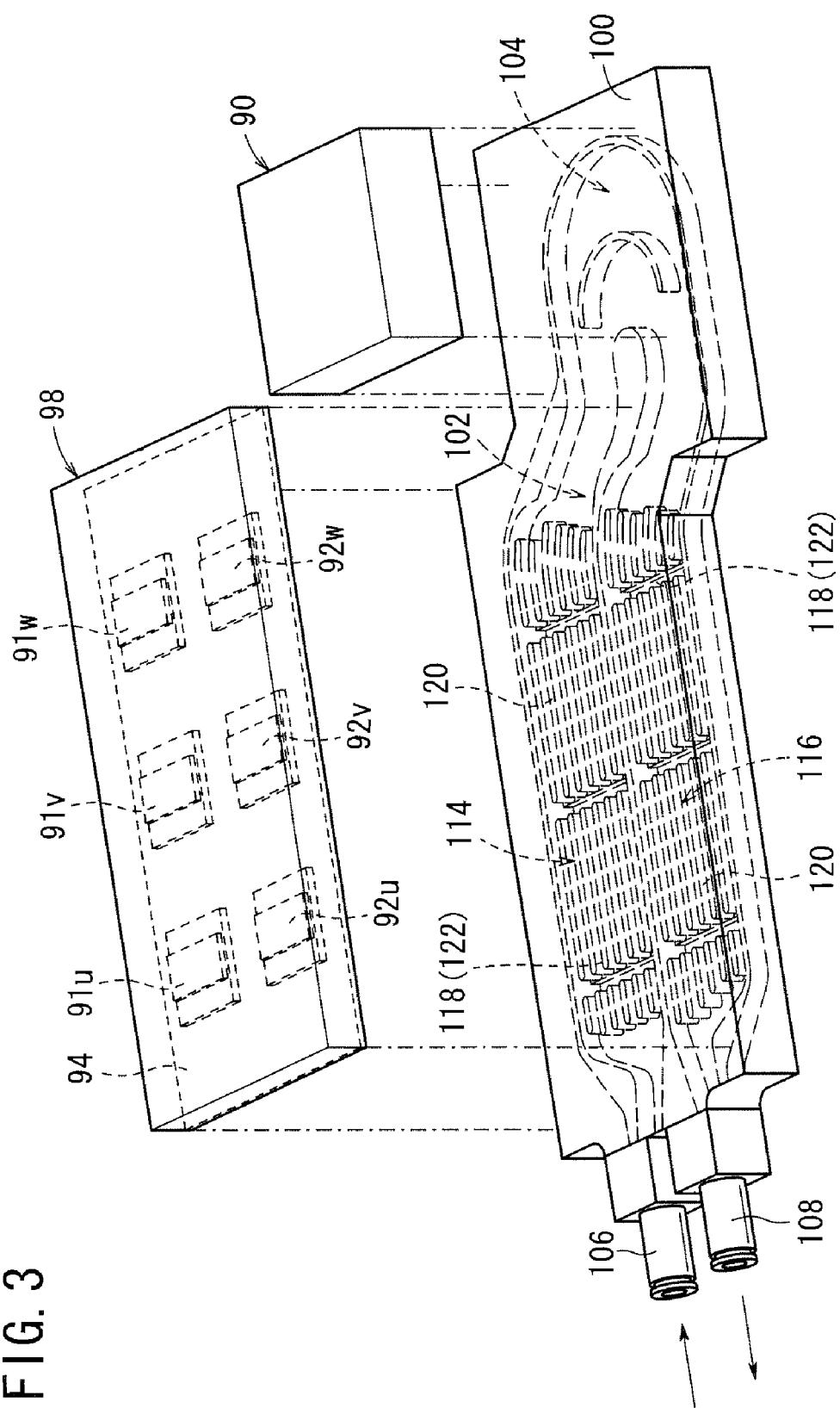
FIG. 3 is a perspective view showing the structure of a cooling apparatus according to an embodiment of the present invention.

As shown in FIG. 3, the cooling apparatus 10 includes a casing 100 in the form of a flat box, and a cooling liquid passage 102 through which a cooling liquid (e.g., water or a coolant) passes. The cooling liquid passage 102 is housed in the casing 100. The cooling apparatus 10 enables high heat conductivity between a surface of the casing 100 and the cooling liquid passage 102 (cooling liquid). The cooling liquid passage 102 has a U-shaped folded section 104 between respective opposite ends thereof. Cooling liquid supplied and discharged through an inlet port 106 and an outlet port 108, which are juxtaposed on one side surface of the casing 100, circulates through the cooling liquid passage 102 in order to cool the switching module 98, which is placed closely to the casing 100 with the heat radiating plate 94 interposed therebetween.

As shown in FIG. 1, a circulation pump 110 and a radiator 112 are connected to the cooling liquid passage 102 through the inlet port 106 and the outlet port 108. When the circulation pump 110 is actuated, cooling liquid is circulated through the cooling liquid passage 102 and discharged from the outlet port 108. Heat from the cooling liquid then is radiated, whereby the cooling liquid is cooled in the radiator 112. Thereafter, the cooling liquid is circulated from the inlet port 106 into the cooling liquid passage 102 in order to cool the switching module 98.

Figure 4:
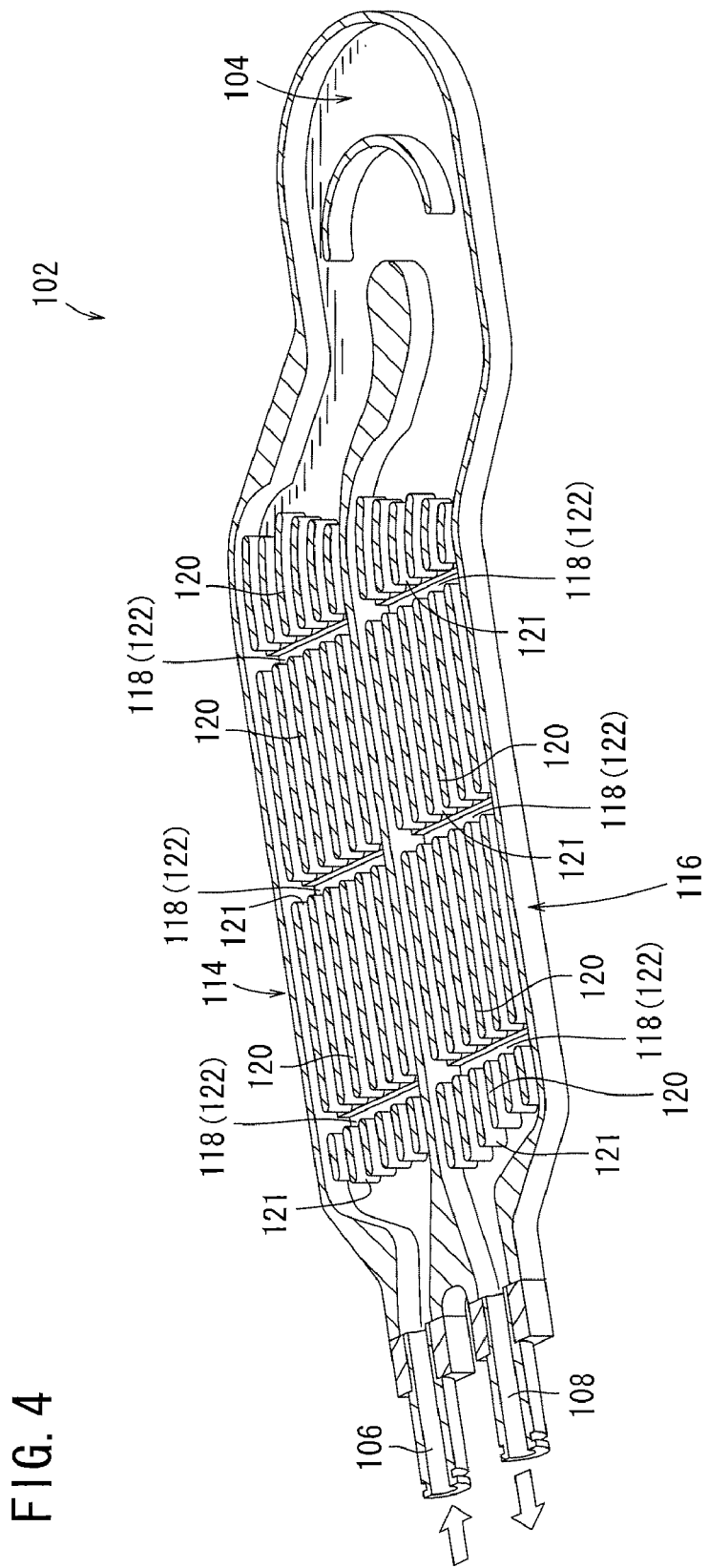
FIG. 4 is a sectional perspective view showing a cooling liquid passage in the cooling apparatus in cross section taken along the direction in which a cooling liquid flows.
Figure 5:
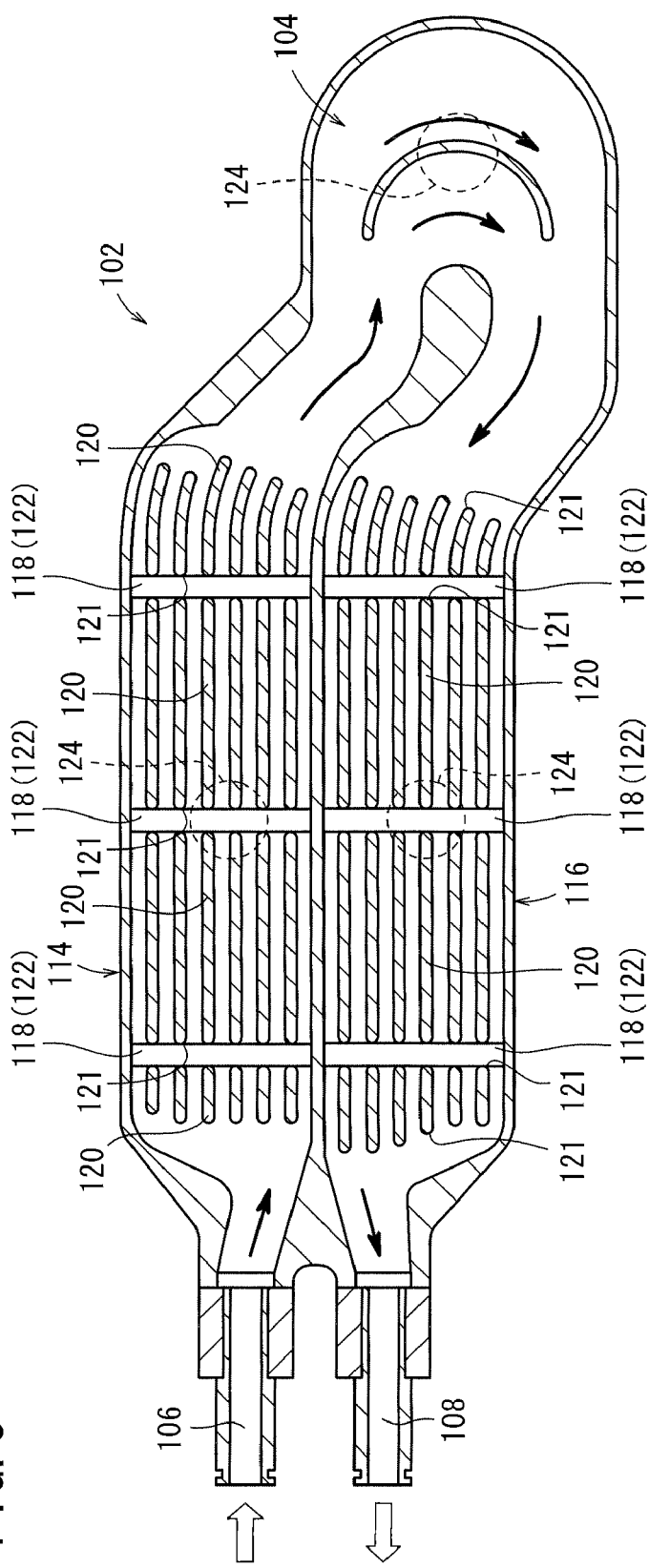
FIG. 5 is a sectional plan view showing the cooling liquid passage in the cooling apparatus in cross section taken along the direction in which the cooling liquid flows.

As shown in FIGS. 4 and 5, the cooling liquid passage 102 includes a first straight section (upper straight section) 114 through which the cooling liquid, which flows in from the inlet port 106 immediately after the cooling liquid has been cooled by the radiator 112, flows initially, the folded section 104 for reversing the direction in which the cooling liquid flows after the cooling liquid has passed through the first straight section 114, and a second straight section (lower straight section) 116 through which the cooling liquid that has passed through the folded section 104 flows. The cooling liquid, which has passed through the second straight section 116, is delivered again through the outlet port 108 into the radiator 112. Since the cooling liquid passage 102 includes the first straight section 114 and the second straight section 116, which extend in parallel to each other with the folded section 104 connected therebetween, the cooling liquid passage 102 is significantly reduced in size overall. Since the inlet port 106 and the outlet port 108 can be juxtaposed, the cooling liquid passage 102 can be installed on the fuel cell vehicle 20 with increased layout freedom.

Each of the straight sections 114, 116 has a plurality of (six in the present embodiment) cooling fins (heat radiating fins) 120, which extend along the direction in which the cooling liquid flows. Each of the cooling fins 120 is divided into four segments in the flow direction (longitudinal direction) by three recesses (gaps) 118. The cooling fins 120 comprise thin plates of copper, aluminum, or the like, and are capable of transmitting heat from the switching module 98 with high efficiency. The cooling fins 120 have curved round portions (rounded shapes) 121 at ends thereof in the flow direction.

The recesses 118 serve to divide the cooling fins 120 at given positions along the longitudinal direction, thereby providing spaces, i.e., chambers 122, in the straight sections 114, 116 where the cooling fins 120 are not present. The recesses 118 are disposed at spaced intervals corresponding to the chips 91$u$ through 91$w$ and 92$u$ through 92$w$ of the switching module 98 (see FIG. 6). In other words, each of the straight sections 114, 116 includes three chambers at positions corresponding to the chips 91$u$ through 91$w$ and 92$u$ through 92$w$.

Figure 6:
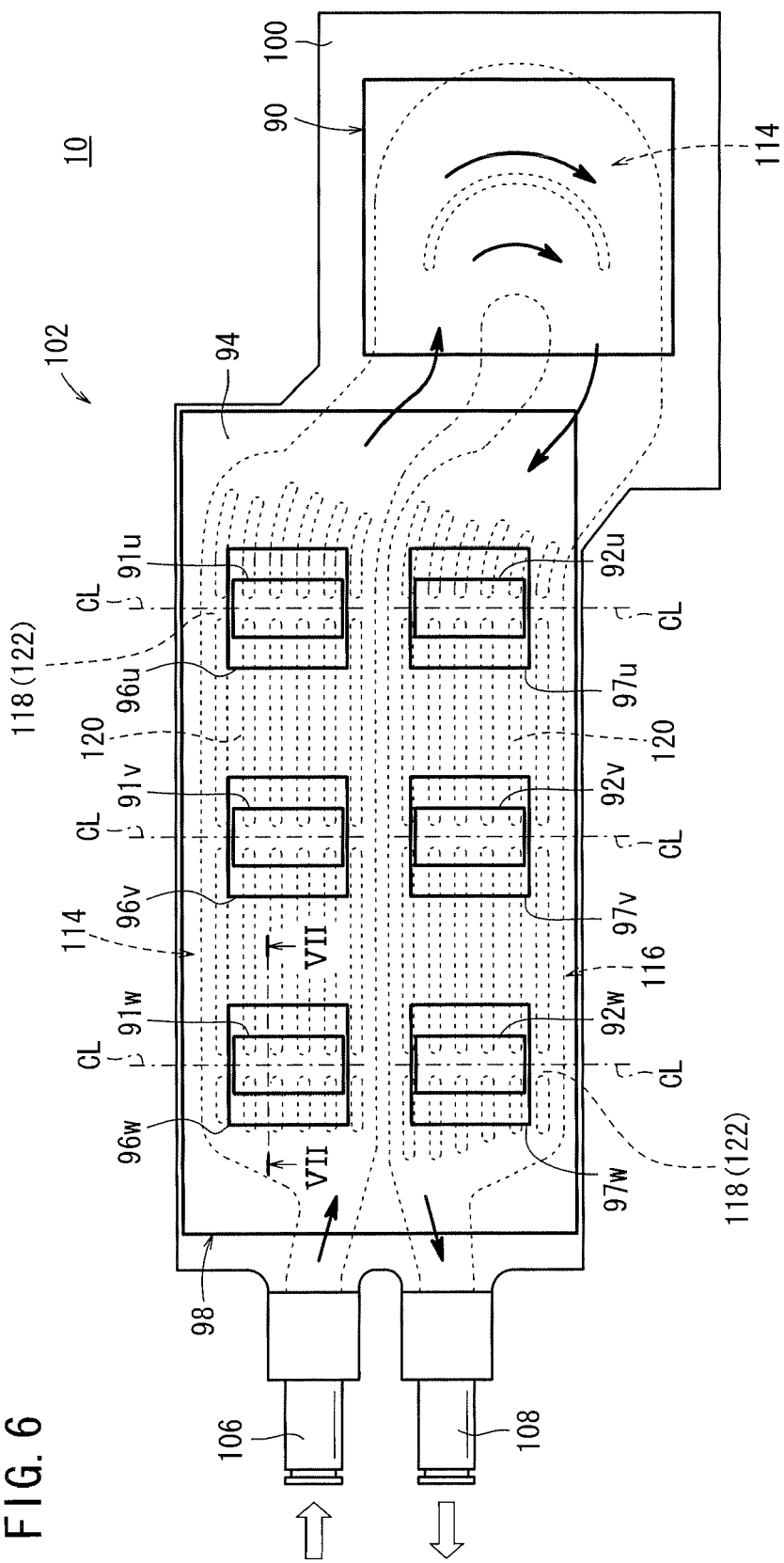
FIG. 6 is a plan view of the cooling apparatus.
Figure 7:
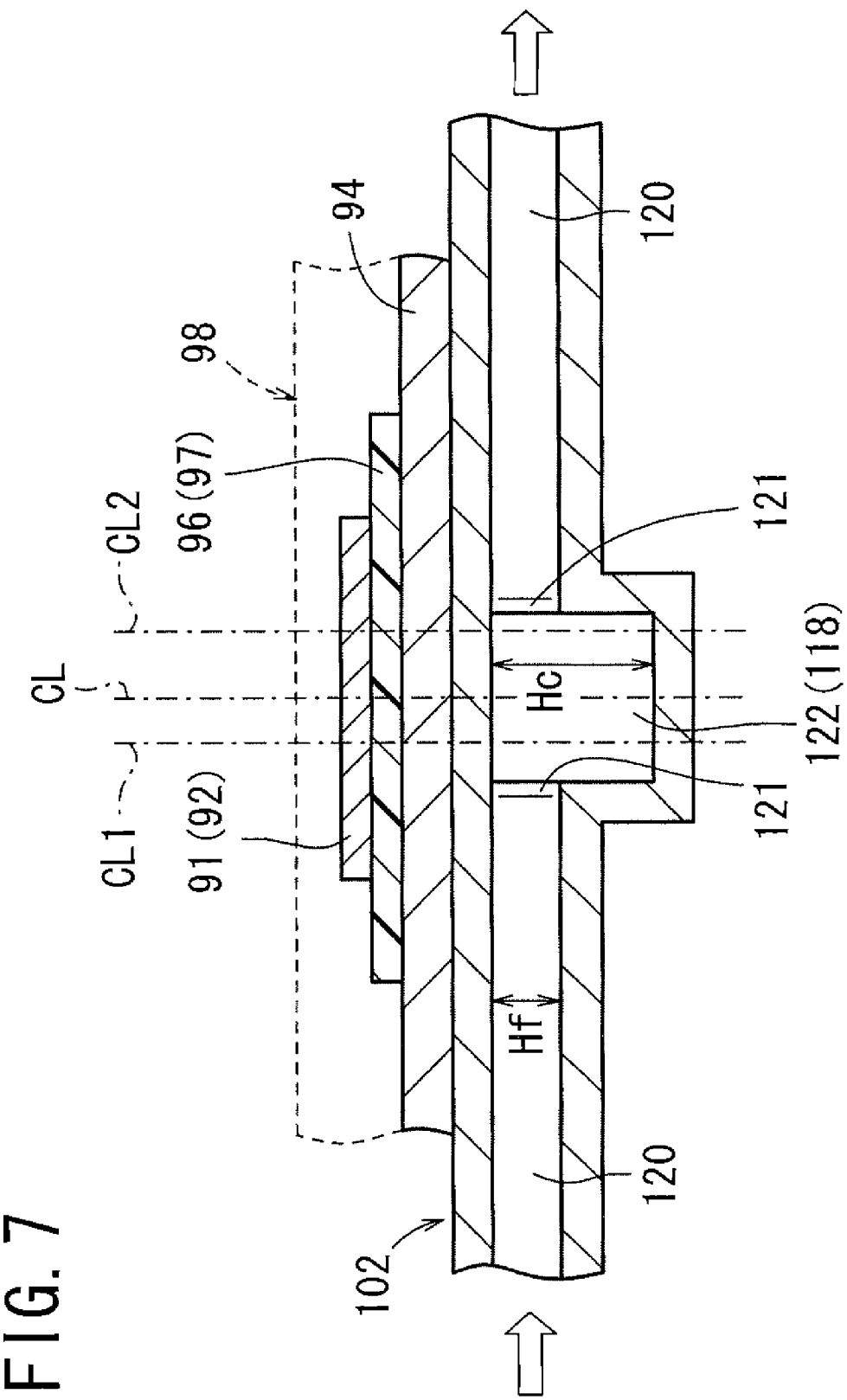
FIG. 7 is a cross-sectional view taken along line VII-VII of FIG. 6.

As can be seen from FIGS. 6 and 7, the chambers 122 are disposed at respective positions corresponding to central lines CL, which extend through the centers of the chips 91$u$ through 91$w$ and 92$u$ through 92$w$, which act as heat emission devices, in the flow direction of the cooling liquid. The chambers 122 have a height Hc, which is greater than the height Hf of the cooling fins 120 (Hc>Hf), so that the volume thereof is made as large as possible. For further increasing the volume of the chambers 122, the dimension of the chambers 122 in the widthwise direction (i.e., the direction perpendicular to the flow direction of the cooling liquid) can also be increased.

In FIG. 5, the broken-line circles shown by reference character 124 represent sand removal holes, which are used when the cooling liquid passage 102 is cast. If such sand removal holes 124 are positioned in alignment with the chambers 122, then the volume of the chambers 122 can further be increased.

In the cooling apparatus 10, the upper chips 91$u$ through 91$w$ that operate in the regenerative mode are disposed over the first straight section 114, which is positioned upstream of the folded section 104, whereas the lower chips 92$u$ through 92$w$ that operate in a propulsive power mode are disposed over the second straight section 116, which is positioned downstream of the folded section 104. The reactor 90 may be disposed over the folded section 104. If the reactor 90 is disposed over the folded section 104, no other cooling apparatus needs to be provided for cooling the reactor 90, i.e., the reactor 90 can be cooled simultaneously (see FIGS. 3 and 6), and thus the space of the folded section 104 is utilized effectively.

Operations and advantages of the cooling apparatus 10 according to the present embodiment, constructed basically as described above, will be described below, together with the fuel cell vehicle 20, which incorporates the cooling apparatus 10 therein.

Figure 8:
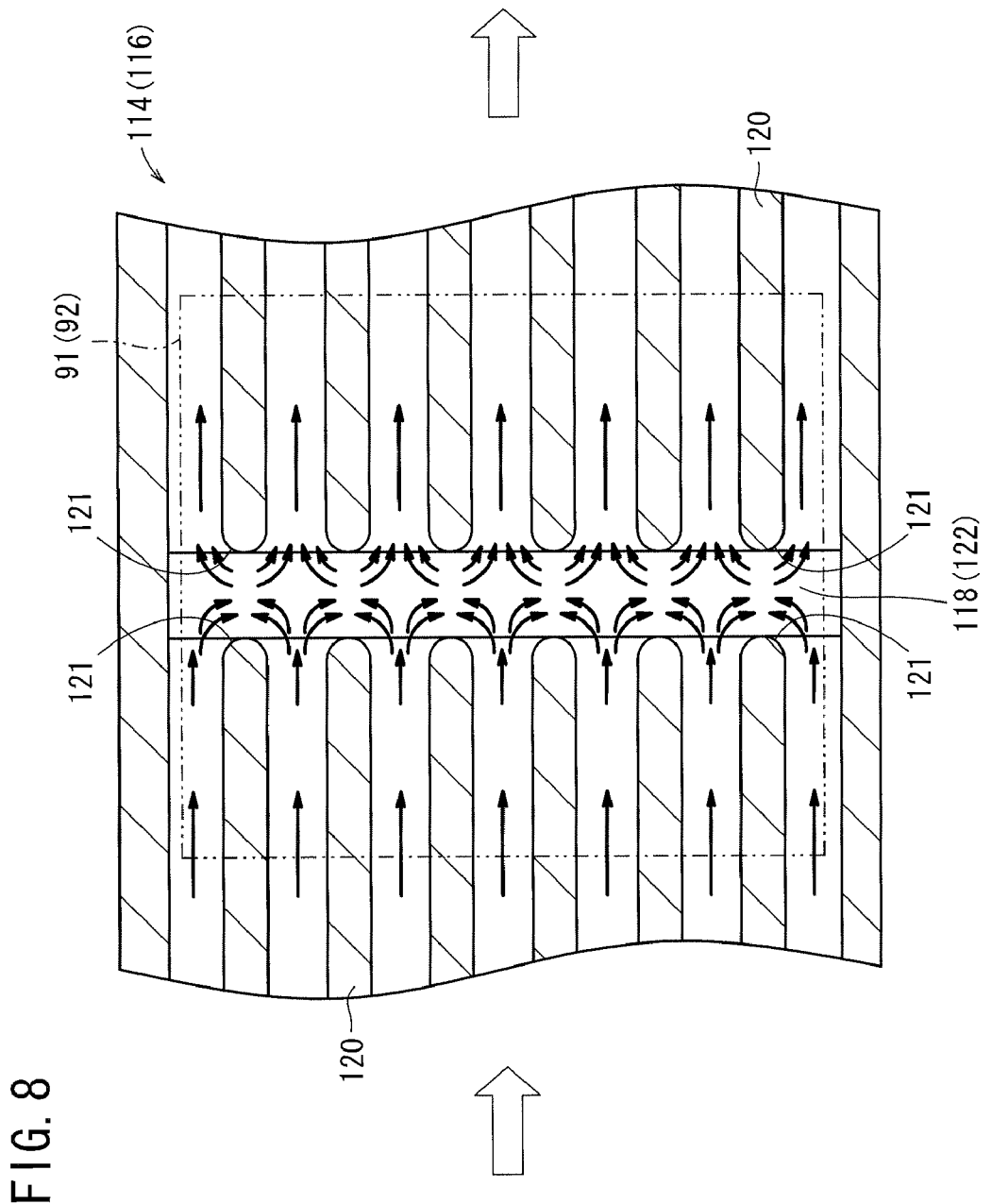
FIG. 8 is a view showing flow of the cooling liquid near a chamber in the cooling liquid passage.

As described above, the straight sections 114, 116 corresponding to the chips 91$u$ through 91$w$ and 92$u$ through 92$w$ of the switching module 98 include the cooling fins 120. Further, the cooling fins 120 include the recesses 118, so as to provide the chambers 122. Consequently, cooling liquid that flows through the straight sections can flow from narrow passageways between the cooling fins 120 into wider spaces provided by the chambers 122, so that the cooling liquid develops disturbances therein (see FIG. 8). Stated otherwise, the cooling liquid flowing through the straight sections 114, 116 is regulated so as to flow in a laminar or closely laminar manner between the cooling fins 120, while the cooling liquid develops disturbances within the chambers 122. In the chambers 122, therefore, heat conductivity between the cooling liquid and the switching module 98 is significantly increased, thus increasing the cooling capability of the cooling apparatus 10, and also enabling the cooling apparatus 10 to be reduced in size while achieving a desired cooling capability.

Furthermore, the height Hc of the chambers 122 is greater than the height Hf of the cooling fins 120, so as to make the volume of the chambers 122 as large as possible compared with the volume at the cooling fins 120. Thus, the cooling capability is increased, while minimizing any increase in the size of the cooling liquid passage 102.

As shown in FIGS. 6 and 7, the centers of the chips 91$u$ through 91$w$ and 92$u$ through 92$w$, which act as heat emission devices, correspond to the chambers 122 at least in the flow direction of the cooling liquid, so that the chambers 122, which act as disturbance developing positions, can be disposed directly beneath the heat emission devices. Consequently, heat generated by the chips 91$u$ through 91$w$ and 92$u$ through 92$w$ can be radiated more efficiently, so that the cooling capability of the cooling apparatus 10 can further be increased. The chambers 122 need not necessarily be disposed at equal intervals in the flow direction of the cooling liquid, as shown in FIG. 6, but may be disposed at intervals corresponding to spaced intervals between the chips 91$u$ through 91$w$ and 92$u$ through 92$w$, which act as heat emission devices.

The above statement that "the centers of the heat emission devices correspond to the chambers 122 at least in the flow direction of the cooling liquid" implies that the central lines CL, which extend through centers of the chips 91$u$ through 91$w$ and 92$u$ through 92$w$, which act as heat emission devices, may be positioned within the chambers 122, and hence, the central lines CL may be positioned at a central line CL1 or CL2 in FIG. 7. The above statement that "the centers of the heat emission devices correspond to the chambers 122 at least in the flow direction of the cooling liquid" also implies that the centers of chips that emit the greatest heat from among the chips 91$u$ through 91$w$ and 92$u$ through 92$w$, which act as heat emission devices (e.g., the centers of chips that emit the greatest heat or chips in greatest need of cooling, among the arm switching devices 81$u$ through 81$w$ and 82$u$ through 82$w$ or the diodes 83$u$ through 83$w$ and 84$u$ through 84$w$) may be disposed at positions corresponding to the chambers 122.

In the cooling apparatus 10, the ends of the cooling fins 120, which correspond to the recesses 118, include the round portions 121. Consequently, cooling liquid flows smoothly from the chambers 122 into the passageways between the cooling fins 120, without causing a large pressure loss, as is the case with the above conventional structure including edges. Therefore, a smooth flow of cooling liquid in the cooling liquid passage 102 can be achieved, together with increasing the cooling capability. Furthermore, inasmuch as the load on the circulation pump 110 is reduced, the circulation pump 110 can be reduced in size, thereby allowing the cooling apparatus 10 to be reduced in size and weight, and increasing the layout freedom with which the cooling apparatus can be installed.

As shown in FIG. 6, the heat radiating plate 94, which serves as a heat spreader, is disposed on the surface of the switching module 98 that abuts against the casing 100. The chips 91u through 91w and 92u through 92w, which act as heat emission devices, are disposed on a common heat radiating plate 94. Therefore, with the chambers 122 being disposed directly below the chips 91u through 91w and 92u through 92w, which generate the greatest amount of heat, the heat dispersed from the chips 91u through 91w and 92u through 92w into the heat radiating plate 94 is efficiently radiated through the heat radiating plate 94 toward the cooling fins 120. In other words, the heat from the chips 91u through 91w and 92u through 92w can be exchanged with the cooling liquid throughout a wider area, thus resulting in an increase in the cooling capability of the cooling apparatus 10.

In the DC/DC converter 36, which is cooled by the cooling apparatus 10, the amount of heat generated by the upper chips 91u through 91w and the lower chips 92u through 92w of the switching module 98 may be different from each other. Normally, the amount of heat generated by the upper chips 91u through 91w, which operate in the regenerative mode, is greater than the lower chips 92u through 92w, which operate in the propulsive power mode.

The fuel cell vehicle 20 is characterized such that the voltage across the fuel cell 22 drops when the fuel cell vehicle 20 produces a high output level. Even if the vehicle produces the same output level in a regenerative mode and a propulsive power mode, the voltage difference between the primary end 1S and the secondary end 2S of the arm switching devices 81u-81w and 82u through 82w is greater in the regenerative mode, in which the voltage difference is affected by a counterelectromotive force of the motor, than in the propulsive power mode, thereby increasing the switching loss. Consequently, if an identical cooling design is given to the devices in the regenerative mode (the upper chips 91u through 91w) and in the propulsive power mode (the lower chips 92u through 92w), then the devices in the regenerative mode are held under more thermally strict conditions, and are unable to produce as high a regenerated amount of energy as in the propulsive power mode.

The cooling apparatus 10 according to the present embodiment is constructed such that the upper chips 91u through 91w are disposed over the first straight section 114, which is positioned upstream of the folded section 104, and the lower chips 92u through 92w are disposed over the second straight section 116, which is positioned downstream of the folded section 104. More specifically, in the cooling liquid passage 102, cooling liquid flows toward the upper arm switching devices 81u through 81w that operate in the regenerative mode, which generates a greater amount of heat (thermal load). Thereafter, the cooling liquid flows in series via the folded section 104 toward the lower arm switching devices 82u through 82w that operate in the propulsive power mode. Therefore, the devices in the regenerative mode, which generate a greater amount of heat, are cooled initially, so that the upper arm switching devices 81u through 81w are prevented from becoming overheated, whereby a maximum output level and the time during which the maximum output level can be generated are maximized.

Accordingly, the cooling capability of the DC/DC converter 36 in the regenerative mode is effectively increased, and the amount of electric power that can be regenerated by the fuel cell vehicle 20 is increased.

The cooling liquid passage 102 comprises a U-shaped structure in which the first straight section 114 is contiguous to the second straight section 116 via the folded section 104. Consequently, the inlet port 106 and the outlet port 108 can be located on one side of the cooling apparatus 10. Therefore, the cooling apparatus 10 can be further reduced in size, while the pipes connected to the circulation pump 110 and the radiator 112 can easily be simplified. Alternatively, rather than the U-shaped structure including the folded section 104, the cooling liquid passage 102 may comprise a straight or curved structure in view of the installation space on the vehicle.

Figure 9:
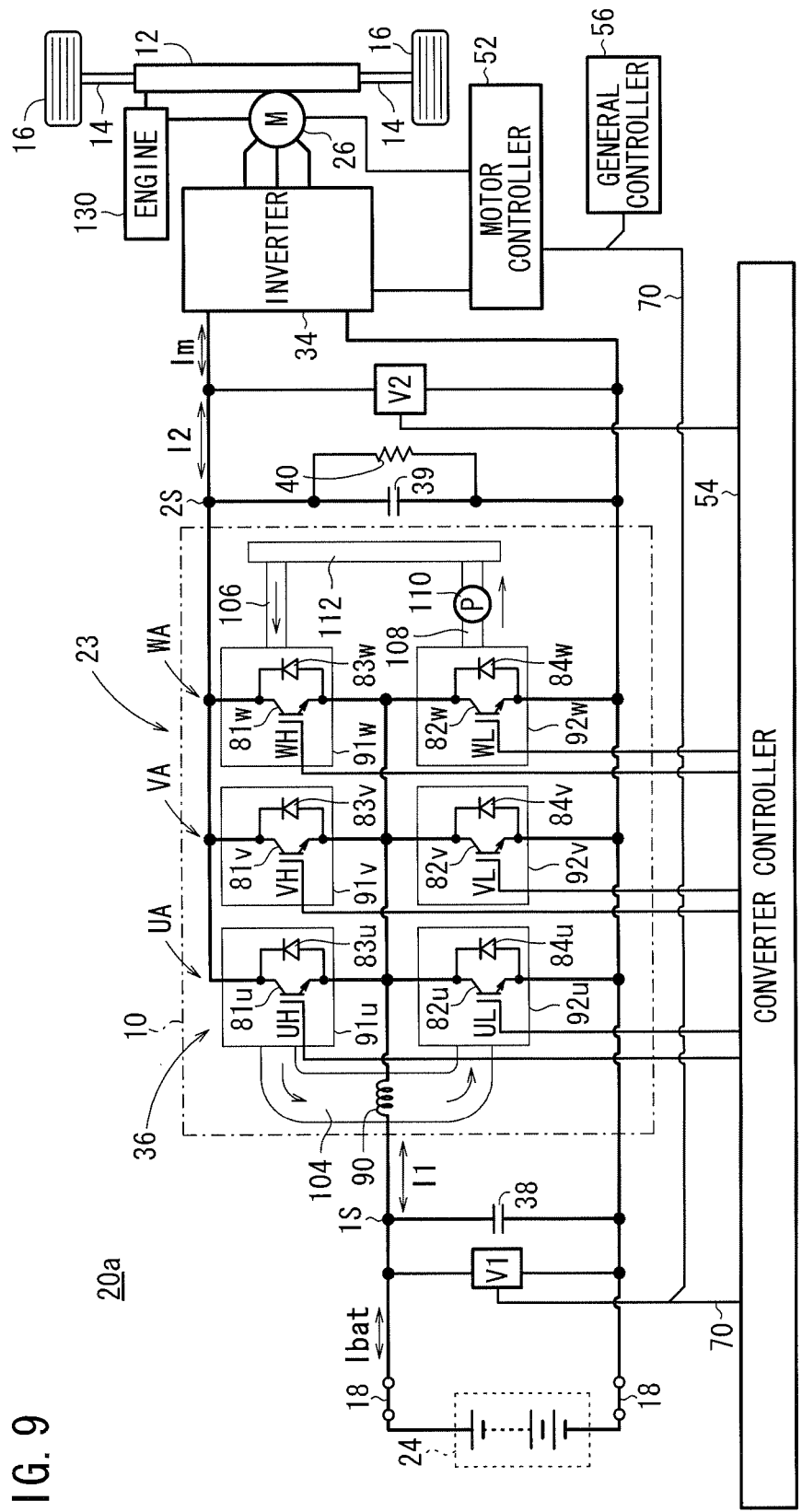
FIG. 9 is a circuit diagram of a fuel cell vehicle according to a modification.

As shown in FIG. 9, the fuel cell vehicle 20, which serves as an electric vehicle according to the present embodiment, may be modified into an electric vehicle 20a devoid of the fuel cell 22 and its related components, and which includes an engine (internal combustion engine) 130 the output shaft of which is connected to the motor 26 and the speed reducer 12. Such an electric vehicle 20a is constructed as a parallel hybrid vehicle.

Figure 10:
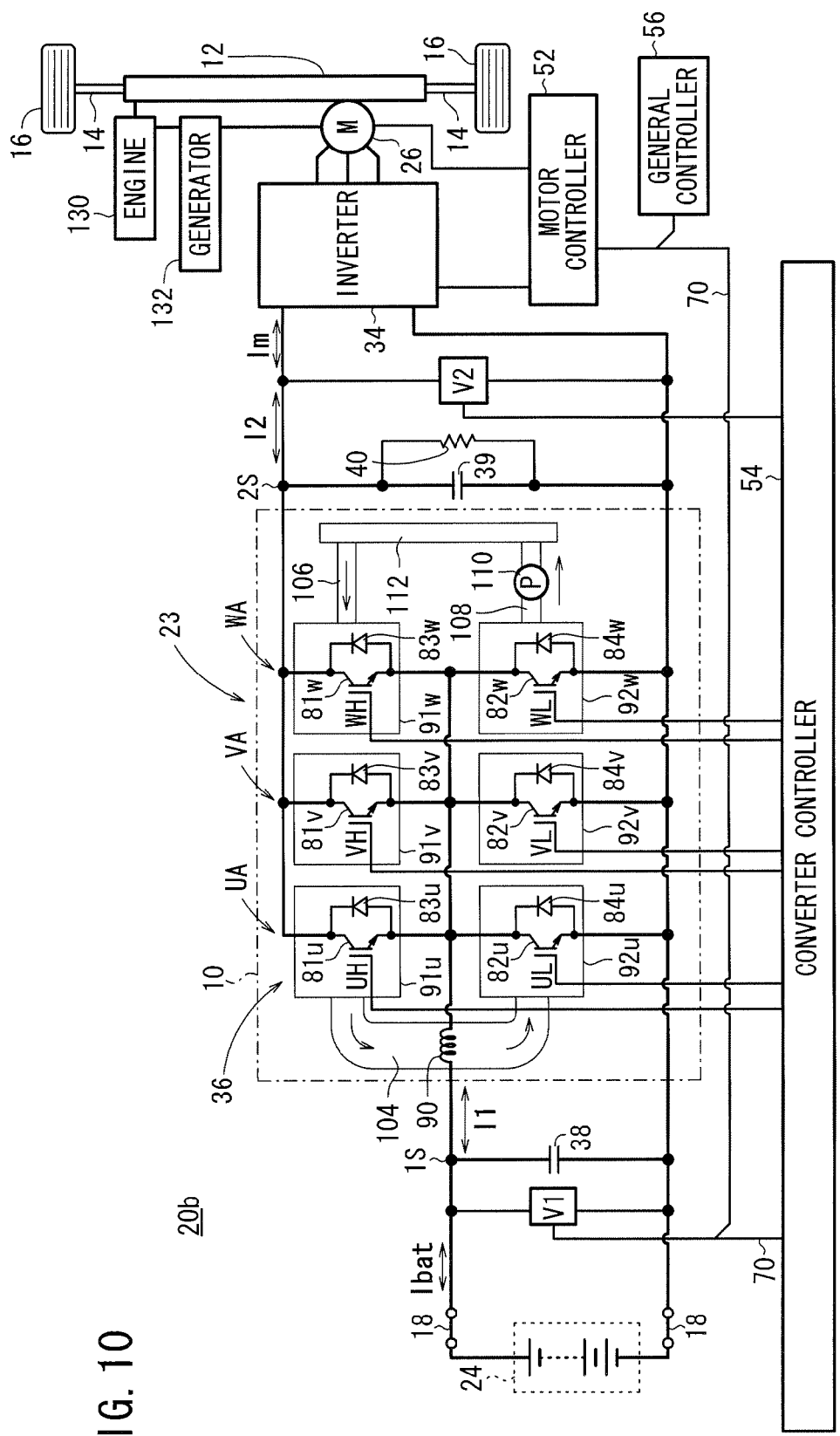
FIG. 10 is a circuit diagram of a fuel cell vehicle according to another modification.

Furthermore, as shown in FIG. 10, the fuel cell vehicle 20, which serves as an electric vehicle according to the present embodiment, may be modified into an electric vehicle 20b devoid of the fuel cell 22 and its related components, and which includes an engine 130 and an electric generator 132, the engine 130 having an output shaft connected to the electric generator 132 and the speed reducer 12, and the electric generator 132 being connected electrically to the motor 26. Such an electric vehicle 20b is constructed as a series/parallel hybrid vehicle. If the output shaft of the engine 130 is connected to only the electric generator 132 and not to the speed reducer 12, or the speed reducer 12 itself is dispensed with, then the electric vehicle 20b is constructed as a series hybrid vehicle.

The fuel cell vehicle 20 as an electric vehicle according to the present embodiment may be constructed as an electric vehicle that is devoid of the fuel cell 22 and its related components, with the engine 130, etc., not being added thereto.

The present invention is not limited to the above embodiment, but may incorporate various additional or modified arrangements therein without departing from the scope of the invention.

The invention claimed is:

1. A cooling apparatus for cooling a heat emission device, comprising:
   a cooling liquid passage for passing a cooling liquid therethrough, the cooling liquid passage having a plurality of cooling fins;
   the cooling fins having recesses defined therein at positions corresponding to at least a center of the heat emission device in a flow direction of the cooling liquid, the recesses defining a chamber without an introduction port for additional cooling liquid, in the cooling liquid passage,
   wherein the center of the heat emission device is positioned within the chamber in a plan view in which the heat emission device overlaps with the cooling liquid passage.

2. A cooling apparatus according to claim 1, wherein the cooling fins have round portions at ends thereof in at least the flow direction of the cooling liquid.

3. A cooling apparatus according to claim 1, further comprising:
   a heat spreader disposed between the heat emission device and the cooling fins;
   a plurality of the heat emission devices being disposed in common on the heat spreader.

4. An electric vehicle comprising:
a cooling apparatus according to claim 1;
an electric motor for rotating wheels;
an electric generator and an electricity storage device for supplying electric power in a parallel relationship to the electric motor; and
a DC/DC converter connected between the electricity storage device and the electric generator, for converting voltage generated by the electricity storage device and applying the converted voltage to the electric motor, and converting voltage regenerated by the electric motor in a regenerative mode or voltage generated by the electric generator and applying the converted voltage to the electricity storage device,
wherein the heat emission device includes a switching device provided in the DC/DC converter.

5. An electric vehicle according to claim 4, wherein the electric generator comprises a fuel cell.

6. A cooling apparatus for cooling a heat emission device, comprising:
a cooling liquid passage for passing a cooling liquid therethrough, the cooling liquid passage having a plurality of cooling fins;
the cooling fins having recesses defined therein at positions corresponding to at least a center of the heat emission device in a flow direction of the cooling liquid, the recesses defining a chamber in the cooling liquid passage, wherein a height of the chamber is greater than a height of the cooling fins;
a heat spreader disposed between the heat emission device and the cooling finds; and
a plurality of the heat emission devices being disposed in common on the heat spreader.

7. A cooling apparatus according to claim 6, wherein the cooling fins have round portions at ends thereof in at least the flow direction of the cooling liquid.

8. An electric vehicle comprising:
a cooling apparatus according to claim 6;
an electric motor for rotating wheels;
an electric generator and an electricity storage device for supplying electric power in a parallel relationship to the electric motor; and
a DC/DC converter connected between the electricity storage device and the electric generator, for converting voltage generated by the electricity storage device and applying the converted voltage to the electric motor, and converting voltage regenerated by the electric motor in a regenerative mode or voltage generated by the electric generator and applying the converted voltage to the electricity storage device,
wherein the heat emission device includes a switching device provided in the DC/DC converter.

9. An electric vehicle according to claim 8, wherein the electric generator comprises a fuel cell.

10. A cooling apparatus for cooling a heat emission device, comprising:
a cooling liquid passage for passing a cooling liquid therethrough, the cooling liquid passage having a plurality of cooling fins;
the cooling fins having recesses defined therein at positions corresponding to at least a center of the heat emission device in a flow direction of the cooling liquid, the recesses defining a chamber without an introduction port for additional cooling liquid, in the cooling liquid passage,
wherein the recesses cause disturbances in a flow of the cooling liquid at a position corresponding to a center of the heat emission device in a flow direction of the cooling liquid.

11. A cooling apparatus according to claim 10, wherein the cooling fins have round portions at ends thereof in at least the flow direction of the cooling liquid.

12. A cooling apparatus according to claim 10, further comprising:
a heat spreader disposed between the heat emission device and the cooling fins;
a plurality of the heat emission devices being disposed in common on the heat spreader.

13. An electric vehicle comprising:
a cooling apparatus according to claim 10;
an electric motor for rotating wheels;
an electric generator and an electricity storage device for supplying electric power in a parallel relationship to the electric motor; and
a DC/DC converter connected between the electricity storage device and the electric generator, for converting voltage generated by the electricity storage device and applying the converted voltage to the electric motor, and converting voltage regenerated by the electric motor in a regenerative mode or voltage generated by the electric generator and applying the converted voltage to the electricity storage device,
wherein the heat emission device includes a switching device provided in the DC/DC converter.

14. An electric vehicle according to claim 13, wherein the electric generator comprises a fuel cell.

* * * * *